United States Patent [19]

Rosenberg et al.

[11] Patent Number: 4,975,065

[45] Date of Patent: Dec. 4, 1990

[54] MICROWAVE CIRCUIT MODULE CONNECTOR

[75] Inventors: John C. Rosenberg, Placerville; James P. Slupe, Davis, both of Calif.

[73] Assignee: Avantek, Inc., Milpitas, Calif.

[21] Appl. No.: 412,651

[22] Filed: Sep. 26, 1989

[51] Int. Cl.$^5$ .............................................. H05K 1/00

[52] U.S. Cl. ...................................... 439/63; 439/654; 333/245

[58] Field of Search ..................... 439/86, 88, 89, 607, 439/608, 578-585, 63, 65, 67, 654; 333/33, 245, 246, 260

[56] References Cited

U.S. PATENT DOCUMENTS

| | | | |
|---|---|---|---|
| 3,551,874 | 7/1968 | Volinskie | 339/17 |
| 4,035,054 | 7/1977 | Lattanzi | 439/578 |
| 4,125,308 | 5/1977 | Schilling | 339/17 LC |
| 4,126,370 | 11/1978 | Nijman | 439/608 |
| 4,187,481 | 2/1980 | Boutros | 439/608 |
| 4,206,963 | 4/1979 | English et al. | 339/147 R |
| 4,507,708 | 3/1985 | Lindberg | 333/260 |
| 4,534,602 | 5/1982 | Bley | 339/14 R |
| 4,556,271 | 12/1985 | Hubbard | 439/578 |
| 4,603,926 | 12/1983 | Nesbit et al. | 339/17 C |
| 4,605,269 | 6/1984 | Cohen et al. | 339/17 LC |
| 4,656,441 | 8/1984 | Takahashi et al. | 333/33 |
| 4,659,156 | 6/1985 | Johnescu et al. | 339/17 C |
| 4,669,805 | 6/1987 | Kosugi et al. | 439/581 |
| 4,690,471 | 5/1986 | Marabotto et al. | 439/63 |
| 4,715,821 | 8/1986 | Axell | 439/59 |
| 4,724,409 | 7/1986 | Lehman | 333/260 |
| 4,734,046 | 3/1986 | McAllister et al. | 439/101 |
| 4,741,703 | 1/1987 | Johnescu et al. | 439/63 |

FOREIGN PATENT DOCUMENTS

| | | | |
|---|---|---|---|
| 2933042 | 3/1981 | Fed. Rep. of Germany | 439/578 |
| 0039101 | 3/1984 | Japan | 439/63 |

*Primary Examiner*—David L. Pirlot
*Attorney, Agent, or Firm*—Limbach, Limbach & Sutton

[57] ABSTRACT

Adjacent microwave circuit modules are coaxially connected by means of insulating plugs, in which through-pins are embedded, recessed mounted in bores in the opposed walls of a pair of modules and an inter-connector made of an insulating material and containing sockets for mating with the through-pins, the inter-connector being dimensioned such that it can be inserted half way into each of the bores.

7 Claims, 5 Drawing Sheets

MICROWAVE CIRCUIT MODULE CONNECTOR

BACKGROUND OF THE INVENTION

1. Technical Field

This invention relates to electrical connectors and more particularly to coaxial connectors for packaged microwave circuits.

2. Technical Field

Recently, microwave circuit designers have produced a standardized microwave circuit package for containing, under hermetically sealed conditions, various types of microwave integrated circuits. These component packages, however, must be connected together to comprise specific systems.

In the past, designers have often used so-called "softboard" with a microstrip line to connect the various microwave circuit packages to integrate packaging into a small, compact system. Unfortunately the electromagnetic interference (EMI) problems associated with the various exposed (i.e. unshielded) microstrip traces caused such problems as crosstalk, signal loss, and noise degradation, which severely limited the overall performance of the system.

SUMMARY OF THE INVENTION

The above and other problems of prior art packaged, microwave circuit connectors are overcome by the present invention of a coaxial, inter-connector for a microwave circuit module comprising a hollow cylinder made of electrically insulating material and a pair of back-to-back, electrically conductive sockets mounted inside of the cylinder and in electrical contact with each other. In the preferred embodiment, the exterior surface of the cylinder is fitted with an EMI gasket, i.e. a gasket made of electrically conductive, elastomeric material.

In the preferred embodiment, each microwave circuit package module includes a coaxial, male plug which is recessed into one wall of the module. The plug includes a glass seal having a bore in which a conductive pin is secured, the pin extending both towards the external and internal sides of the connecting wall of the module. The end of the pin which extends inside of the module package is electrically connected to the circuit. The external end of the pin is intended to be received in one of the sockets of the inter-connector.

In operation, the inter-connector cylinder is partially inserted into a bore in the wall of the module so that the EMI gasket is coplanar with the external side of the connecting wall and the package's coaxial pin is completely engaged in one of the sockets.

An adjacent microwave circuit module is similarly engaged in the second of the two sockets, allowing the connecting walls of the two modules to contact each other.

It is therefor an object of the invention to electrically interconnect microwave circuit modules in a configuration which minimizes risk of coaxial pin damage.

Another object of the invention is to minimize the number of parts required to electrically interconnect microwave circuit modules.

Still another object of the invention is to allow electrically interconnected microwave circuits to be arranged in the smallest possible area by providing an internal connection allowing walls of adjacent modules to abut each other.

It is yet a further object of the invention to provide a means for electrically interconnecting microwave circuit modules while minimizing signal degradation due to EMI.

The foregoing and other objectives, features and advantages of the invention will be more readily understood upon consideration of the following detailed description of certain preferred embodiments of the invention, taken in conjunction with the accompanying drawings.

DETAILED DESCRIPTION OF THE DRAWINGS

Figure 1:
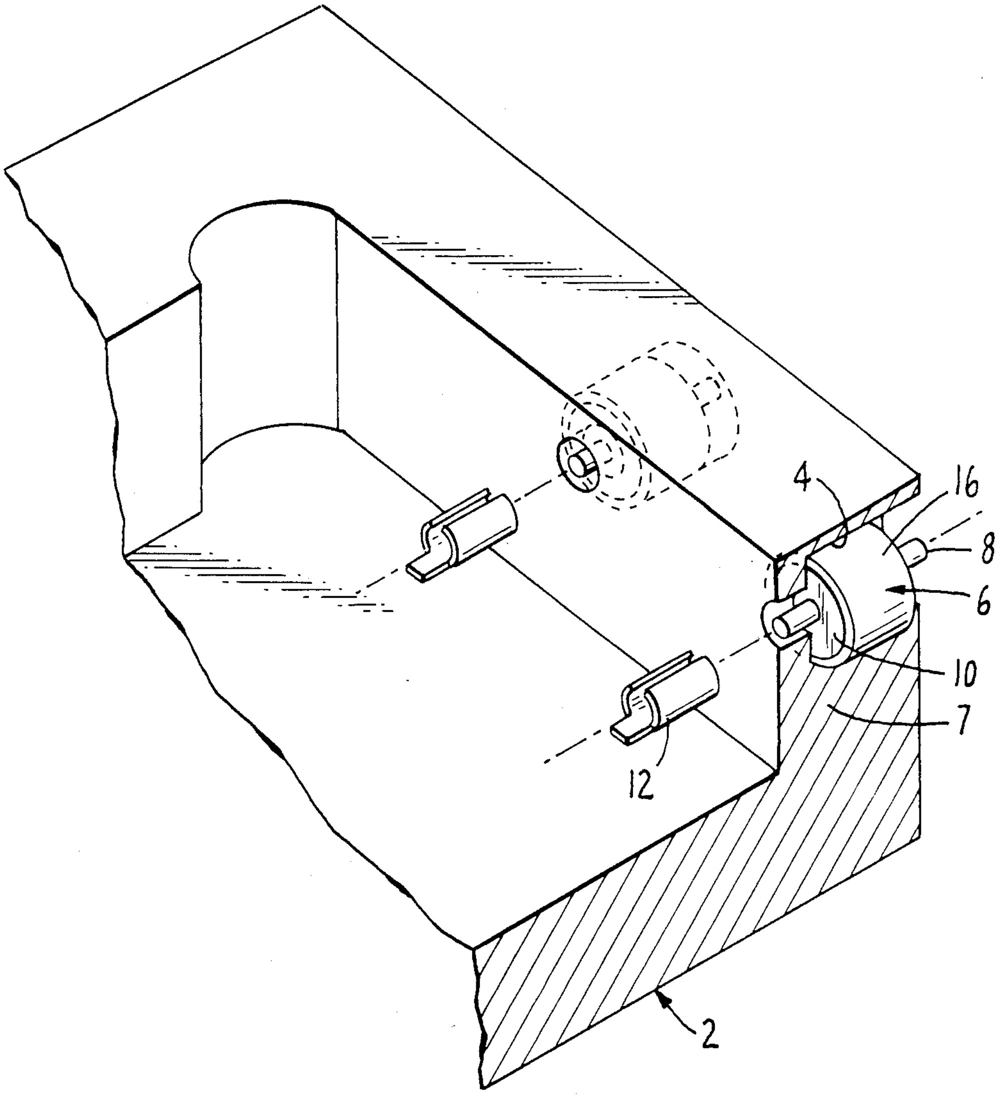
FIG. 1 is an enlarged, perspective, exploded view, with portions broken away and in section, of the microwave circuit module inter-connector according to the invention.
Figure 2:
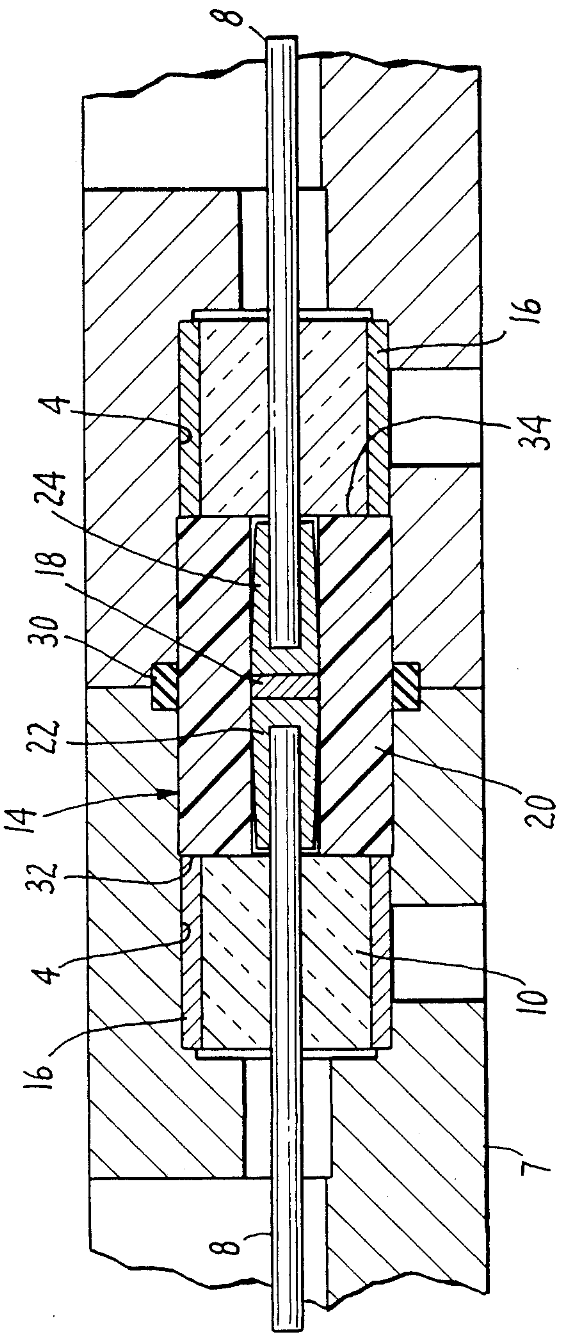
FIG. 2 is a vertical elevation view, in section, of the microwave circuit module inter-connector according to the invention.

FIGS. 1 and 2 depict the preferred embodiment of the invention. A coaxial plug 6 is affixed by a layer of solder into a bore 4 in a wall 7 of a microwave circuit module 2. The coaxial plug 6 contains a glass seal 10 surrounding a conductive pin 8. The glass seal 10 is, in turn, surrounded by a Kovar® seal 16. The pin 8 exnal directions relative to the microwave circuit module 2, and preferably has a length which is approximately equal to the length of the bore 4. The internal end of the pin 8 is attached to a conductive socket 12 which is electrically connected to a circuit (not shown) contained within the microwave circuit module 2. The external end of the pin 8 is received in a inter-connector 14 as shown in FIG. 2.

Referring now more particularly to FIG. 2, there is shown a cross section of the inter-connector 14. It is comprised of a hollow tube 20 made of tetrafluoroethylene. A pair of back-to-back sockets 22, 24, made of beryllium copper for efficient conduction, are contained within the hollow tube 20 and are mechanically and electrically attached to each other, as by a layer of solder 18, for example. The sockets 22, 24 are complimentary in size to the pin 8 of the coaxial plug 6 so that conductivity is maximized.

An EMI gasket 30 made of silver impregnated rubber surrounds the external circumference of the tube 20 at a locus preferably equidistant from the two ends 32 and 34 of the tube 20.

The plane defined by the core of the gasket 30 splits the inter-connector 14 into two identical portions. A first portion of the inter-connector 14 is installed into the connecting wall 7 of the microwave circuit module 2, so that the gasket 30 is pressed against the external surface of the connecting wall 7, and the pin 8 of the coaxial plug 6 completely extends to the bottom of the socket 22. The second portion of the inter-connector 14 is similarly installed in an adjacent microwave circuit module facilitating efficient conduction between the two modules and compressing the gasket 30 between the two modules to minimize EMI.

In other embodiments the tube 20 of the inter-connector 14 can be made of suitable nonconductive materials other than tetrafluoroethylene. Similarly, the gasket 30 can be made of other suitable resilient, conductive materials. The sockets 22, 24 can be made of suitable conductive materials other than beryllium copper.

Figure 3:
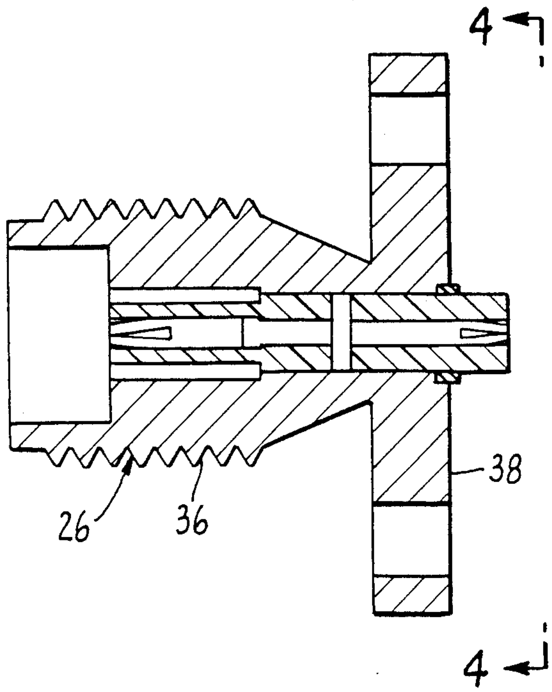
FIG. 3 is an enlarged, vertical, sectional view of an inter-connector according to a second embodiment of the invention.
Figure 4:
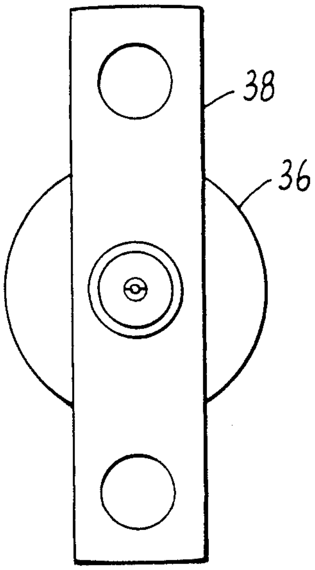
FIG. 4. is a vertical view taken generally along the lines 4—4 in FIG. 3.

Referring now more particularly to FIGS. 3 and 4, the inter-connector 14 is shown installed in a flange mounted coaxial connector 26, instead of between two module packages 2. The connector 26 includes a threaded portion 36, for attachment to a standard coaxial cable end, for example, and a flange portion 38, for attachment to the module package wall 7. The inter-connector 14 is inserted into a bore in the connector 26 and extends beyond the flange portion 38 to be receivable in the bore 4 of a package 2, as shown in FIGS. 1 and 2.

Figure 5:
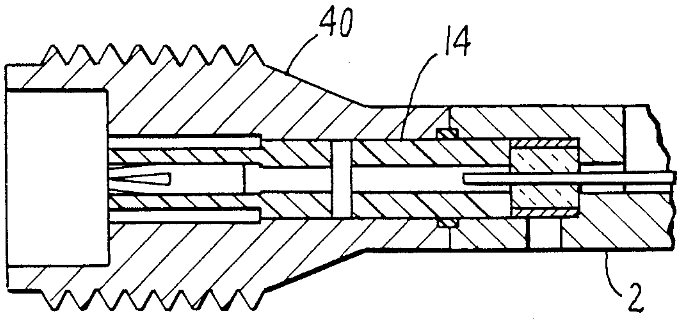
FIG. 5 is an enlarged, vertical, sectional view of an inter-connector according to a third embodiment of the invention.

Similarly, FIG. 5 shows a threaded connector 40 similarly connected to a module package 2 by means of an inter-connector 14.

Figure 6A:
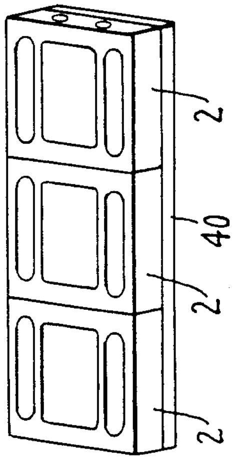
FIGS. 6A and 6B are perspective views illustrating the manner in which microwave circuit modules are interconnected using the inter-connector of the invention.
Figure 6B:
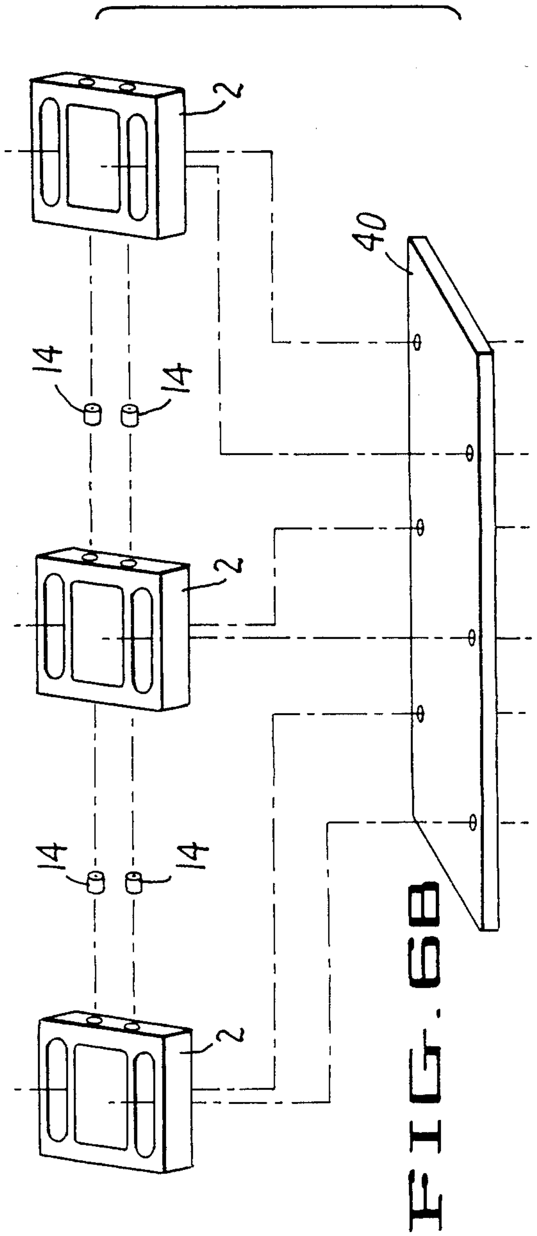

FIGS. 6A and 6B illustrate the manner in which microwave circuit modules 2 are interconnected using the inter-connector 14 of the invention. The interconnected modules are mounted on a conductive plate 40.

Figure 7:
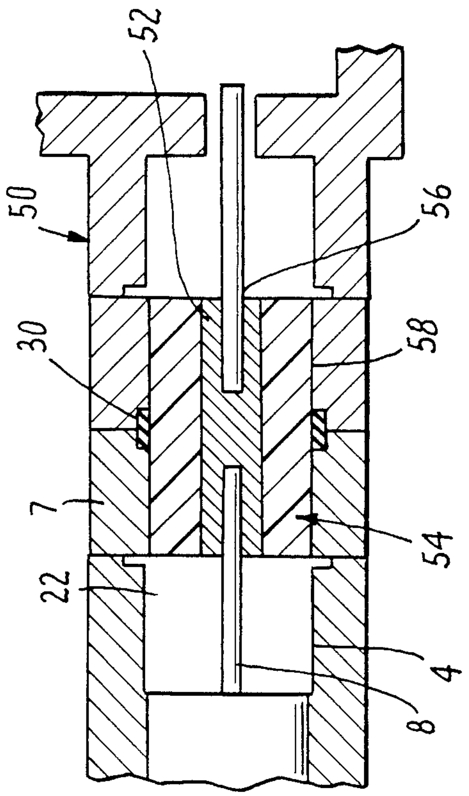
FIG. 7 is a vertical, sectional view of a microwave circuit module connected to a field probe waveguide interface by the inter-connector of the invention.

In FIG. 7 a field probe waveguide interface 50 is connected to a microwave circuit module 2 by the inter-connector 52. A bore 4 in the wall 7 of the microwave circuit module 2 is dimensioned to receive approximately half of the inter-connector 54 so that the core of the EMI gasket 30 is coplanar with the external surface of the microwave circuit module wall 7. Similarly a bore 58 in the waveguide interface 50 is dimensioned to receive the remaining portion of the inter-connector 54 which is not contained in the microwave circuit module 2. The conductive socket 22 is complimentary in size to the pin 8 which electrically connects the inter-connector 54 to the circuit (not shown) contained within the microwave circuit module 2. The conductive socket 52 is complimentary in size to the conductive pin 56 which extends through the field probe waveguide interface 50.

Although the present invention has been shown and described with respect to preferred embodiments, various changes and modifications which are obvious to a person skilled in the art to which the invention pertains are deemed to lie within the spirit and scope of the invention.

What is claimed is:

1. A system for establishing a coaxial electrical connection between a first microwave circuit module having a first external wall with a first bore therein and a second microwave circuit module having a second external wall with a second bore therein, comprising:

a first plug assembly including a first plug of electrically insulating material and a first conductive pin mounted coaxially in the first plug and extending therethrough, the first plug assembly being mounted in a recessed position in the first bore;

a second plug assembly including a second plug of electrically insulating material and a second conductive pin mounted coaxially in the second plug and extending therethrough, the second plug assembly being mounted in a recessed position in the second bore;

a coaxial inter-connector including a nonconductive tube, first and second conductive sockets placed back-to-back within the tube and electrically and mechanically attached to each other, the first socket being of a complimentary size to the first conductive pin of the first plug and wherein the diameter of the tube is approximately equal to the diameter of the first bore so that the tube can be partially inserted into the first bore and the exterior end of the first pin is captured in the complimentary sized first socket, and the second socket being of a complimentary size to the second conductive pin of the second plug and wherein the diameter of the tube is approximately equal to the diameter of the second bore so that the tube can be partially inserted into the second bore and the exterior end of the second pin is captured in the complimentary sized second socket;

a gasket extending around the circumference of the tube between its ends, the gasket being made of material which is both resilient and electrically conductive and wherein the opposite ends of the inter-connector are partially inserted into the first and second bores so that the gasket is compressed between the first and second external walls, with the pins of the first and second plug assemblies being separately received in the opposed sockets within the inter-connector tube, whereby the first and second microwave circuit modules abut each other and are coaxially, electrically connected.

2. A device as claimed in claim 1, wherein the first and second pins each has a length approximately equal to the first and second bores, respectively.

3. A device as claimed in claim 1, wherein the tube of the inter-connector is made of tetrafluoroethylene.

4. A device as claimed in claim 1, wherein the first and second sockets of the inter-connector comprise beryllium copper.

5. A device as claimed in claim 1, wherein the gasket comprises silver impregnated rubber.

6. A device as claimed in claim 1, further comprising a threaded coaxial connector including a threaded member having a bore therein for receiving at least a portion of the inter-connector therein.

7. A system for establishing a coaxial electrical connection between a first microwave circuit module having a first external wall with a first bore therein and a waveguide interface having a second bore therein, comprising:

a first plug assembly including a first plug of electrically insulating material and a first conductive pin mounted coaxially in the first plug and extending therethrough, the first plug assembly being mounted in a recessed position in the first bore;

a second conductive pin mounted in a recessed position in the second bore;

a coaxial inter-connector including a nonconductive tube, first and second conductive sockets placed back-to-back within the tube and electrically and mechanically attached to each other, the first socket being of a complimentary size to the first conductive pin of the first plug and wherein the diameter of the tube is approximately equal to the diameter of the first bore so that the tube can be partially inserted into the first bore and the exterior end of the first pin is captured in the complimentary sized first socket, and the second socket being of a complimentary size to the second conductive pin of the waveguide interface and wherein the diameter of the tube is approximately equal to the diameter of the second bore so that the tube can be partially inserted into the second bore and the exterior end of the second pin is captured in the complimentary sized second socket;

a gasket extending around the circumference of the tube between its ends, the gasket being made of material which is both resilient and electrically conductive and wherein the opposite ends of the inter-connector are partially inserted into the first and second bores so that the gasket is compressed between the first external walls and the microwave interface, with the pins of the first plug assembly and the waveguide being separately received in the opposed sockets within the inter-connector tube, whereby the first microwave circuit module and the waveguide interface abut each other and are coaxially, electrically connected.

* * * * *